(12) United States Patent
Noda et al.

(10) Patent No.: US 9,000,351 B2
(45) Date of Patent: Apr. 7, 2015

(54) SEMICONDUCTOR INTEGRATED CIRCUIT AND OPTICAL SENSOR DEVICE USING THE SAME

(71) Applicants: Kazuo Noda, Osaka (JP); Takahiro Inoue, Osaka (JP)

(72) Inventors: Kazuo Noda, Osaka (JP); Takahiro Inoue, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 357 days.

(21) Appl. No.: 13/683,800

(22) Filed: Nov. 21, 2012

(65) Prior Publication Data

US 2013/0134297 A1 May 30, 2013

(30) Foreign Application Priority Data

Nov. 24, 2011 (JP) ................. 2011-256566

(51) Int. Cl.
| | |
|---|---|
| H01L 31/00 | (2006.01) |
| H01H 37/76 | (2006.01) |
| G01J 1/44 | (2006.01) |
| G11C 17/16 | (2006.01) |
| G11C 17/18 | (2006.01) |

(52) U.S. Cl.
CPC .............. H01H 37/761 (2013.01); G01J 1/44 (2013.01); G11C 17/16 (2013.01); G11C 17/18 (2013.01)

(58) Field of Classification Search
USPC ............... 257/431; 250/208.1, 214.1, 214 R, 250/214 DC
See application file for complete search history.

(56) References Cited

U.S. PATENT DOCUMENTS

| | | | | |
|---|---|---|---|---|
| 5,384,727 A | * | 1/1995 | Moyal et al. ................. | 365/96 |
| 5,446,407 A | * | 8/1995 | Yamamoto ................. | 327/525 |
| 2007/0296403 A1 | | 12/2007 | Mori et al. | |
| 2012/0299639 A1 | * | 11/2012 | Kaneyasu ................. | 327/525 |

FOREIGN PATENT DOCUMENTS

| | | |
|---|---|---|
| JP | 63-164239 A | 7/1988 |
| JP | 10-74839 A | 3/1998 |
| JP | 2007-323786 A | 12/2007 |
| JP | 2008-293206 A | 12/2008 |
| JP | 2011-181626 A | 9/2011 |
| JP | 2011-209236 A | 10/2011 |

* cited by examiner

*Primary Examiner* — Francis M Legasse, Jr.
(74) *Attorney, Agent, or Firm* — Birch, Stewart, Kolasch & Birch, LLP

(57) ABSTRACT

A resistor array is provided in an element array. A mean value of a characteristic-value distribution is associated with a median of combined resistance values obtained by the element array. An array of trimming information pieces corresponding to combined resistance values larger than the median is set in a descending order of '15' to '8' in decimal number, and an array of trimming information pieces corresponding to combined resistance values less than the median is set in an ascending order of '0' to '7' in decimal number. A circuit converts trimming information derived from the trimming information generation circuit to generate element selection information for selecting turn-off resistors to obtain combined resistance values from the resistor array. Thus, the number of melted-and-cut fuses involved in generation of trimming information associated within the range of "mean value±2σ" in the distribution is reduced.

7 Claims, 10 Drawing Sheets

SEMICONDUCTOR INTEGRATED CIRCUIT AND OPTICAL SENSOR DEVICE USING THE SAME

CROSS-REFERENCE TO RELATED APPLICATIONS

This nonprovisional application claims priority under 35 U.S.C. §119(a) on Patent Application No. 2011-256566 filed in Japan on Nov. 24, 2011, the entire contents of which are hereby incorporated by reference.

TECHNICAL FIELD

The present invention relates to a semiconductor integrated circuit and an optical sensor device using the semiconductor integrated circuit.

BACKGROUND ART

Optical sensors to be contained in portable equipment have been under desires for higher sensitivity and higher accuracy.

In manufacture of such optical sensors, variations in light-reception sensitivity or characteristic variations in light-emission intensity have been at issue. As a result, there is a need for providing the semiconductor integrated circuit forming an optical sensor with a fuse-containing trimming circuit and adjusting the semiconductor integrated circuit by melt-and-cut of fuses so as to reduce the manufacturing variations of the optical sensor. In this case, since the melt-and-cut of the fuses causes the semiconductor integrated circuit to be damaged, the number of fuses to be melted and cut is desirably as small as possible.

As such a semiconductor integrated circuit including the fuse-containing trimming circuit as shown above, a semiconductor integrated circuit device is disclosed in JP S63-164239 A. This semiconductor integrated circuit device, as shown in FIG. 8, includes an analog circuit 3, which is a circuit to be corrected, a first trimming circuit 1 for correcting a circuit constant of the analog circuit 3 in an increasing-direction, and a second trimming circuit 2 for correcting a circuit constant of the analog circuit 3 in a decreasing-direction. The first trimming circuit 1 has resistors R1, R2, R3 having weighted resistance values R, 2R, 4R, respectively, while the second trimming circuit 2 has resistors R4, R5, R6 having weighted resistance values R, 2R, 4R, respectively.

The resistors R1-R6 are connected to fuse elements F1-F6 serving as storage elements via switching elements (transistors) Q1-Q6 and inverters, respectively, where programming (writing) onto the individual fuse elements F1-F6 is achieved by applying a specified program voltage to a terminal pad P.

That is, fuse elements to which the program voltage is applied from the terminal pad P are melted and cut to go OFF state, and resistors corresponding to the melt-and-cut only are disconnected from the analog circuit 3. In contrast to this, non-melted-and-cut resistors are connected in parallel to an emitter load resistor $R_E$ of the analog circuit 3. Thus, resistors to be disconnected are selected by the programming to correct the circuit constant of the analog circuit 3.

Also, as a semiconductor integrated circuit including a trimming information generation circuit for detecting information as to fuses melted and cut by the trimming circuit to generate and output trimming information, a semiconductor integrated circuit device is disclosed in JP 2008-293206 A. This semiconductor integrated circuit device, as shown in FIG. 9, includes a trimming signal generation circuit 6 and a variable resistor element 7.

The trimming signal generation circuit 6 detects melt-and-cut information on the built-in fuses to output it as trimming information.

In the variable resistor element 7, series-connected five resistors R0-R4 are provided, and the individual resistors R0, R1, R2, R3, R4 have weighted resistance values R, R, 2R, 4R, 8R, respectively. Further, source and drain of a transistor MN0 serving as a switching element is connected to both ends of the resistor R1. For the rest, similarly, source and drain of a transistor MN1 are connected to both ends of the resistor R2, source and drain of a transistor MN2 are connected to both ends of the resistor R3, and source and drain of a transistor MN3 are connected to both ends of the resistor R4.

Also, a trimming signal terminal FUSE[0] of the trimming signal generation circuit 6 is connected to gate of the transistor MN0. For the rest, similarly, a trimming signal terminal FUSE[1] is connected to gate of the transistor MN1, a trimming signal terminal FUSE[2] is connected to gate of the transistor MN2, and a trimming signal terminal FUSE[3] is connected to gate of the transistor MN3.

As described before, the number of fuses to be melted and cut for adjustment of the semiconductor integrated circuit device 5 is desirably as small as possible and, for this purpose, the number itself of fuses required for the adjustment is desirably small as well. As a trimming signal generation circuit 6 in which the fuses for adjustment are lessened in number as described above, a circuit construction as shown in FIG. 10 is conceivable.

In the trimming signal generation circuit 6 shown in FIG. 10, internal circuits 6a-6d are provided for individual trimming signal terminals FUSE[0]-FUSE[3], respectively, and one fuse is provided for each one of the internal circuits 6a-6d, correspondingly. Then, in the internal circuit 6a, a node N0 connected to the trimming signal terminal FUSE[0] is connected to a power supply Vcc via a pull-up resistor $R_B0$ and moreover grounded via a fuse F0. Similarly also in the internal circuits 6b-6d, the trimming signal terminal FUSE[1] is connected to a power supply Vcc via a pull-up resistor $R_B1$ and moreover grounded via a fuse F1, the trimming signal terminal FUSE[2] is connected to a power supply Vcc via a pull-up resistor $R_B2$ and moreover grounded via a fuse F2, and the trimming signal terminal FUSE[3] is connected to a power supply Vcc via a pull-up resistor $R_B3$ and moreover grounded via a fuse F3.

In the semiconductor integrated circuit device 5 of the above-described construction, for example, when the fuse F2 of the internal circuit 6c is melted and cut, a trimming signal of a voltage close to the power supply voltage Vcc is outputted from the corresponding trimming signal terminal FUSE[2]. Then, the transistor MN2 of the variable resistor element 7 is turned on, so that both ends of the resistor R3 are short-circuited. Meanwhile, on condition that the fuse F1 of the internal circuit 6b is not melted and cut, the corresponding trimming signal terminal FUSE[1] remains grounded. Then, the transistor MN1 of the variable resistor element 7 keeps in the OFF state, so that both ends of the resistor R2 are not short-circuited. Thus, transistors corresponding to melted-and-cut fuses are turned on, so that both ends of the corresponding resistors are short-circuited. As a result, a combined resistance value of the series-connected resistors R0-R4 is a total value of resistance values of the resistors corresponding to the non-melted-and-cut fuses.

FIGS. 11A-11E show: trimming information which is formed of a 4-bit bit string (least significant bit corresponds to trimming signal terminal FUSE[0]) representing four trimming signals simultaneously outputted from the trimming signal terminals FUSE[0]-FUSE[3] to select resistors that are short-circuited and nullified from the array of resistors R1-R4 in the variable resistor element 7 (FIG. 11A); resistor selection information which is formed of a 4-bit bit string (least significant bit corresponds to transistor MN0) representing four resistor selection signals simultaneously inputted to the gates of the transistors MN0-MN3 (FIG. 11B); combined resistance values of the resistors R0-R4 (FIG. 11C); numbers of melted-and-cut fuses (FIG. 11D); and an appearance frequency distribution (hereinafter, referred to simply as distribution from time to time) of a certain characteristic value of the obtained semiconductor integrated circuit device 5 (FIG. 11E).

Herein, in the trimming information, a '1' stands for a trimming signal of level 'H,' i.e. for a melted-and-cut fuse, while a '0' stands for a trimming signal of level 'L,' i.e. for a non-melted-and-cut fuse. Further, in the resistor selection information, a '1' stands for a resistor selection signal of level 'H,' i.e. for turn-on of a transistor, while a '0' stands for a resistor selection signal of level 'L,' i.e. for turn-off of a transistor.

As shown in FIGS. 11A-11E, in a range of "mean value±2σ (standard deviation)" under which do fall most (95.45%) of manufacturing variations of manufactured semiconductor integrated circuit devices 5, a total number of melted-and-cut fuses equals 10. It is noted that the number of melted-and-cut fuses is a number of '1's in corresponding trimming information.

However, the prior-art semiconductor integrated circuit device 5 shown above has problems as shown below.

That is, the melt-and-cut of fuses causes the semiconductor to be damaged to a considerable extent. Also, there is a fear for occurrence of a problem in reliability of the melt-and-cut, giving adverse effects on the quality. Therefore, the number of melted-and-cut fuses is desirably lessened to the least possible.

In FIGS. 11A-11E, in the manufacturing-variation range of "mean value±2σ (standard deviation)," the number of melted-and-cut fuses per one piece of trimming information is 1 to 3 fuses, which seems smaller numbers at a glance. However, since most (95.45%) of manufacturing variations fall within the manufacturing-variation range of "mean value±2σ (standard deviation)," actually melted-and-cut fuses count a large total number, so that the probability of adverse effects exerted on quality becomes higher correspondingly.

Such a problem similarly matters also in the case of the semiconductor integrated circuit device disclosed in JP S63-164239 A. In addition, as shown in FIG. 8, a program to be inputted to each of the fuse elements F1-F6 is in six bits, which is larger than the four bits of the semiconductor integrated circuit device 5 shown in FIG. 9, the number of melted-and-cut fuses falling within the manufacturing-variation range of "mean value±2σ (standard deviation)" becomes larger to an extent corresponding to the bit difference.

SUMMARY OF INVENTION

Technical Problem

An object of the invention is, therefore, to provide a semiconductor integrated circuit, as well as optical sensor equipment using the semiconductor integrated circuit, which is capable of reducing the number of melted-and-cut fuses in trimming process on manufacturing products in which a characteristic value falls within a range of {mean value±2×(standard deviation)} in an appearance frequency distribution of the characteristic value.

Solution to Problem

In order to solve the problem, the semiconductor integrated circuit according to the present invention comprises:

an operation circuit having a circuit constant and performing an operation corresponding to the circuit constant;

an element array which contains a plurality of arrayed elements and which selectively turns off part of the elements according to element selection information to correct the circuit constant of the operation circuit based on an output of the plurality of elements;

a trimming information generation circuit which contains a plurality of fuses and which generates and outputs trimming information in which whether or not each of the plurality of fuses has been melted and cut is represented by a bit string associated with the individual fuses; and a conversion circuit for converting a bit string of the trimming information outputted from the trimming information generation circuit into the element selection information in which whether or not each of the plurality of fuses is turned off is represented by a bit string associated with the individual elements, wherein as the trimming information for a case where a characteristic value of the operation circuit is a mean value in an appearance frequency distribution of the characteristic value, trimming information representing that a number of melted-and-cut fuses contained in the trimming information generation circuit is a least possible number is assigned, and as the trimming information for cases where the characteristic value falls within a range of {mean value±2×(standard deviation)} in the appearance frequency distribution, trimming information representing that the number of melted-and-cut fuses contained in the trimming information generation circuit is a second least number next to the least number is assigned.

With this constitution, as the trimming information for a case where the characteristic value is a mean value in the appearance frequency distribution, trimming information representing that the number of melted-and-cut fuses is the least possible number is assigned, and as the trimming information for cases where the characteristic value falls within a range of {mean value±2×(standard deviation)} in the appearance frequency distribution, trimming information representing that the number of melted-and-cut fuses is a second least number next to the least number is assigned.

Thus, the number of melted-and-cut fuses involved in trimming on manufactured products in which the characteristic value before correction falls within the range of {the mean value±2×(standard deviation)} in the appearance frequency distribution of the characteristic value can be lessened.

That is, according to this invention, damage to the semiconductor due to melt-and-cut of the fuses in trimming process can be lessened, so that adverse effects on the quality of the semiconductor integrated circuit can be suppressed.

In particular, as the trimming information for the case where the characteristic value before correction from the operation circuit is a mean value in the appearance frequency distribution, trimming information representing that the number of melted-and-cut fuses is the least number is assigned. Therefore, in trimming for most manufactured products in which "the characteristic value before correction is a mean value in the appearance frequency distribution," the number of melted-and-cut fuses can be made to be the least one, so that adverse effects on the quality of the semiconductor integrated circuit can be prevented.

Also, in the semiconductor integrated circuit according to one embodiment, the plurality of elements contained in the element array are arrayed in series, a median resulting when a plurality of combined physical-property values obtained by a combination of non-turned-off elements in the element array are arrayed in an ascending order or descending order is associated with the mean value of the appearance frequency distribution, and moreover each physical-property value smaller or larger in value than the median is associated with the characteristic value smaller than the mean value of the appearance frequency distribution according to a deviation of the appearance frequency distribution, while each physical-property value larger or smaller in value than the median is associated with the characteristic values larger than the mean value of the appearance frequency distribution according to a deviation of the appearance frequency distribution, and the conversion by the conversion circuit is fulfilled by:

converting trimming information, which represents that the number of melted-and-cut fuses is the least possible number, into the element selection information that allows selection of a combination of the turned-off elements so that the trimming information can correspond to a median of the plurality of combined physical-property values, and converting trimming information, which represents that the number of melted-and-cut fuses is a second least number next to the least possible number, into the element selection information that allows selection of a combination of the turned-off elements so that the trimming information can correspond to the combined physical-property value associated with the characteristic value, which falls within the range of {the mean value±2×(standard deviation)} in the appearance frequency distribution, according to a deviation of the appearance frequency distribution.

According to this embodiment, a plurality of combined physical-property values obtained by a combination of non-turned-off elements in the element array can be associated with a plurality of characteristic values on one side of values smaller than the mean value in the appearance frequency distribution and with a plurality of characteristic values on another side of values larger than the mean value, in an ascending order or descending order and with an equal number of characteristic values for each side.

Then, by the conversion circuit, trimming information representing that the number of melted-and-cut fuses is the least number as well as the second least number in succession can be converted into the element selection information for deriving the combined physical-property values associated with the range of {the mean value±2×(standard deviation)} in the appearance frequency distribution.

Also, in the semiconductor integrated circuit according to one embodiment, the assignment of trimming information outputted from the trimming information generation circuit is fulfilled by:

as the trimming information for a case where the characteristic value is a mean value in the appearance frequency distribution, assigning trimming information representing that the number of melted-and-cut fuses contained in the trimming information generation circuit is 0, as the trimming information for cases where the characteristic value falls within either one of a range from the mean value to {the mean value+2×(standard deviation)} and a range from the mean value to {the mean value−2×(standard deviation)} in the appearance frequency distribution, assigning trimming information continuously succeeding the trimming information assigned as trimming information for the case of the mean value, and as the trimming information for cases where the characteristic value falls within the other one of a range from the mean value to {the mean value+2×(standard deviation)} and a range from the mean value to {the mean value−2×(standard deviation)} in the appearance frequency distribution, assigning trimming information obtained by inverting a most significant bit of trimming information assigned to the trimming information for the case of the mean value as well as to the trimming information for the case where the characteristic value falls within the either one of the range from the mean value to {the mean value+2×(standard deviation)} and the range from the mean value to {the mean value−2×(standard deviation)}.

According to this embodiment, bit data of all the lower-order bits except the most significant bit in the trimming information for the case where the characteristic value before correction falls within the other one of the range from the mean value to {the mean value+2×(standard deviation)} and the range from the mean value to {the mean value−2×(standard deviation)} in the appearance frequency distribution can be made identical with bit data of all the lower-order bits except the most significant bit in the trimming information for the case where the characteristic value is the mean value as well as in the trimming information for cases where the characteristic value before correction falls within the either one of the range from the mean value to {the mean value+2×(standard deviation)} and the range from the mean value to {the mean value−2×(standard deviation)}.

Also, in the semiconductor integrated circuit according to one embodiment, the conversion by the conversion circuit is fulfilled by:

converting trimming information, which represents that the number of melted-and-cut fuses contained in the trimming information generation circuit is 0, into the element selection information that allows selection of a combination of the turned-off elements so that a combined physical-property value of the elements in the element array can become a median of the plurality of combined physical-property values, converting trimming information, which continuously succeeds trimming information representing that the number of melted-and-cut fuses is 0, into the element selection information that allows selection of a combination of the turned-off elements so that the trimming information can correspond to the combined physical-property value associated with the either one of the range from the mean value to {the mean value+2×(standard deviation)} and the range from the mean value to {the mean value−2×(standard deviation)} in the appearance frequency distribution, according to the deviation, and converting trimming information, which is obtained by inverting a most significant bit of trimming information representing that the number of melted-and-cut fuses is 0 and trimming information continuously succeeds the trimming information, into the element selection information that allows selection of a combination of the turned-off elements so that the trimming information can correspond to the combined physical-property value associated with the other one of the range from the mean value to {the mean value+2× (standard deviation)} and the range from the mean value to {the mean value−2×(standard deviation)} in the appearance frequency distribution, according to the deviation.

According to this embodiment, by the conversion circuit, first trimming information representing that the number of melted-and-cut fuses is 0, second trimming information continuously succeeding the first trimming information, and trimming information obtained by inverting the most significant bits of the first, second trimming information are converted into the element selection information that allows selection of a combination of turn-off elements so that those trimming information can correspond to a median for a case where a plurality of combined physical-property values obtained by combining non-turned-off elements in the element array are arrayed in ascending order or descending order, and also can correspond to the combined physical-property values associated with the range of {the mean value+2×(standard deviation)} in the appearance frequency distribution and to combined physical-property values neighboring before and after the median. Thus, the conversion circuit can be made simple in circuit construction.

Also, in the semiconductor integrated circuit according to one embodiment, the conversion circuit comprises:

a NOT gate for inverting bit data of most-significant-bit of the trimming information and outputting the resulting data as bit data of the most significant bit of the element selection information; and a plurality of exclusive-OR gates for receiving inputs of bit data of any one bit lower in order than the most significant bit in the trimming information as well as bit data of the most significant bit in the trimming information, and outputting bit data of any one bit lower in order than the most significant bit of the element selection information.

According to this embodiment, circuit construction of the conversion circuit can be made simple with one NOT gate and a plurality of exclusive-OR gates.

Also, in the semiconductor integrated circuit according to one embodiment, after the assignment of the trimming information outputted from the trimming information generation circuit is performed, reassignment of the trimming information is performed so that the higher the appearance frequency in the appearance frequency distribution is, the smaller the number of melted-and-cut fuses is, and that the number of melted-and-cut fuses simply increases with decreasing appearance frequency, and the conversion circuit performs the conversion of the trimming information subjected to the reassignment.

According to this embodiment, reassignment of trimming information is performed so that the higher the appearance frequency in the appearance frequency distribution is, the smaller the number of melted-and-cut fuses is, and that the number of melted-and-cut fuses simply increases with decreasing appearance frequency. Therefore, it becomes possible to further lessen the number of melted-and-cut fuses involved in trimming process on manufacturing products in which the characteristic value before correction falls within the range of {the mean value±2×(standard deviation)} in the appearance frequency distribution of the characteristic value.

Also, the optical sensor device of this invention comprises:

a light-emitting element and a light-receiving element;

a light-emission control circuit for controlling the light-emitting element to emit light; and a light-receiving circuit for amplifying an electrical signal from the light-receiving element, wherein the semiconductor integrated circuit as defined in claim 1 is mounted on at least either one of the light-emission control circuit and the light-receiving circuit.

With this constitution, the semiconductor integrated circuit is mounted on at least either one of the light-emission control circuit and the light-receiving circuit, the semiconductor integrated circuit being capable of lessening the number of melted-and-cut fuses in trimming process on manufactured products in which the characteristic value before correction falls within the range of {the mean value±2×(standard deviation)} in the characteristic-value appearance frequency distribution, and reducing damage to the semiconductor due to melt-and-cut of the fuses, so that adverse effects on the quality can be suppressed.

Therefore, variations in light-reception sensitivity characteristic and variations in light-emission intensity characteristic can be suppressed without impairing the quality of the light-emission control circuit and the light-receiving circuit. As a result, occurrence of defective products can be suppressed, allowing a cost reduction to be achieved.

Advantageous Effects of Invention

As apparent from the above description, in the semiconductor integrated circuit of this invention, as trimming information for a case where a characteristic value of the operation circuit is a mean value in the appearance frequency distribution of the characteristic value, trimming information representing that the number of melted-and-cut fuses in the trimming information generation circuit is the least possible number is assigned, and as the trimming information for cases where the characteristic value falls within the range of {the mean value±2×(standard deviation)} in the appearance frequency distribution, trimming information representing that the number of melted-and-cut fuses is a second least number next to the least number is assigned.

Further, by the conversion circuit, a bit string of the trimming information outputted from the trimming information generation circuit is converted into the element selection information representing whether or not each of the plurality of elements in the element array is turned off by a bit string associated with the individual elements.

Thus, the number of melted-and-cut fuses involved in trimming on manufactured products in which the characteristic value before correction falls within the range of {the mean value±2×(standard deviation)} in the appearance frequency distribution of the characteristic value can be lessened. As a result, damage to the semiconductor due to melt-and-cut of the fuses in trimming process can be lessened, so that adverse effects on the quality of the semiconductor integrated circuit can be suppressed.

In particular, as the trimming information for the case where the characteristic value before correction from the operation circuit is a mean value in the appearance frequency distribution, trimming information representing that the number of melted-and-cut fuses is the least number is assigned. Therefore, in trimming for most manufactured products in which "the characteristic value before correction is a mean value in the appearance frequency distribution," the number of melted-and-cut fuses can be made to be the least one, so that adverse effects on the quality of the semiconductor integrated circuit can be prevented.

Also, according to the optical sensor device of this invention, the semiconductor integrated circuit of the invention is mounted on at least either one of the light-emission control circuit and the light-receiving circuit, the semiconductor integrated circuit being capable of lessening the number of melted-and-cut fuses for manufactured products in which the characteristic value before correction falls within the range of {the mean value±2×(standard deviation)} in the characteristic-value appearance frequency distribution, and reducing damage to the semiconductor due to melt-and-cut of the fuses, so that adverse effects on the quality can be suppressed. Therefore, variations in light-reception sensitivity characteristic and variations in light-emission intensity characteristic can be suppressed without impairing the quality of the light-emission control circuit and the light-receiving circuit.

Thus, occurrence of defective products can be suppressed, allowing a cost reduction to be achieved.

BRIEF DESCRIPTION OF DRAWINGS

The present invention will become more fully understood from the detailed description given hereinbelow and the accompanying drawings which are given by way of illustration only, and thus are not intended to limit the present invention, and wherein.

DESCRIPTION OF EMBODIMENTS

Hereinbelow, the present invention will be described in detail by way of embodiments thereof illustrated in the accompanying drawings.

First Embodiment

Figure 1:
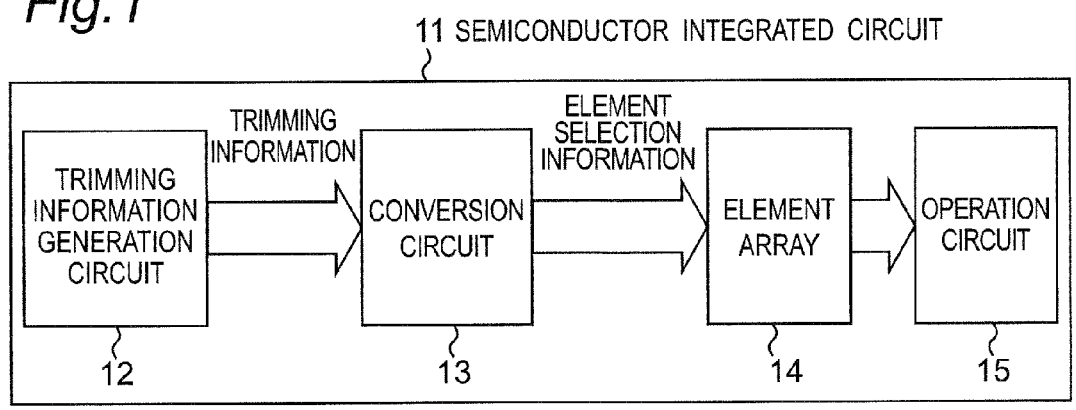
FIG. 1 is an outlined block diagram of a semiconductor integrated circuit according to the invention.

FIG. 1 is an outlined block diagram of a semiconductor integrated circuit according to this embodiment.

In FIG. 1, reference sign 11 denotes a semiconductor integrated circuit, which includes a trimming information generation circuit 12, a conversion circuit 13, an element array 14, and an operation circuit 15.

In this configuration, the trimming information generation circuit 12, having a plurality of fuses contained therein as will be detailed later, generates trimming signals representing whether or not the individual fuses have been melted and cut by trimming, and outputs trimming information formed of a bit string representing trimming signals for all the fuses.

The conversion circuit 13 performs conversion, as will be detailed later, of a bit string of trimming information outputted from the trimming information generation circuit 12 to generate element selection information formed of a bit string. According to the element selection information generated by the conversion circuit 13, the element array 14 selectively turns off part of the element array such as the built-in resistor array or capacitor array to correct a circuit constant of the operation circuit 15 based on an output of the element array. Thus, a characteristic value of the operation circuit 15, i.e. a characteristic value of the semiconductor integrated circuit 11, is corrected.

Figure 2:
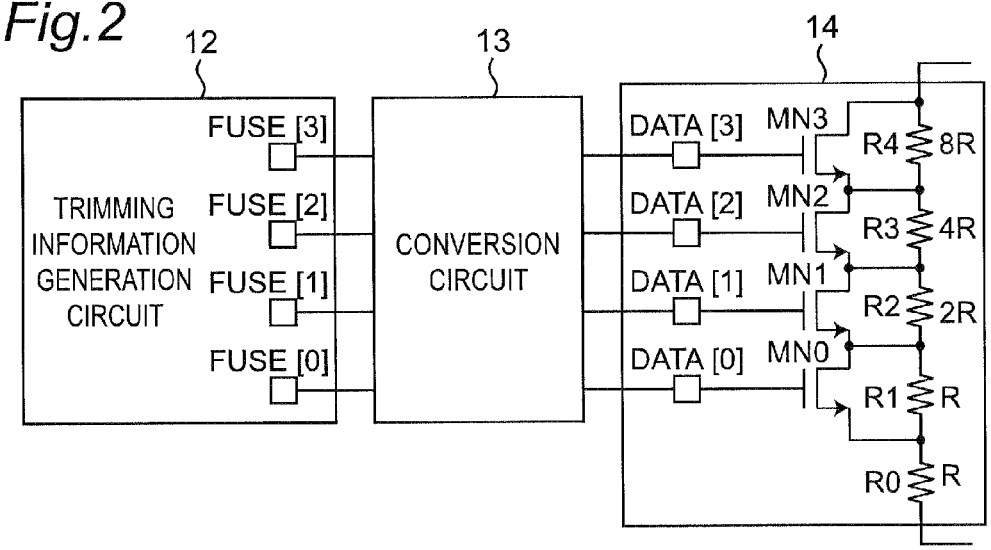
FIG. 2 is a concrete circuit diagram of the element array of FIG. 1.

FIG. 2 shows a specific circuit diagram of the element array 14. The element array 14 in this embodiment has a resistor array and is similar in construction to the variable resistor element 7 of the prior-art semiconductor integrated circuit device 5 shown in FIG. 9. However, the element array 14 is not limited to a resistor array and may be an other element array such as capacitor array.

That is, in the element array 14, series-connected five resistors R0-R4 are provided, and the individual resistors R0, R1, R2, R3, R4 have weighted resistance values R, R, 2R, 4R, 8R, respectively. Further, source and drain of a transistor MN0 serving as a switching element is connected to both ends of the resistor R1. For the rest, similarly, source and drain of a transistor MN1 are connected to both ends of the resistor R2, source and drain of a transistor MN2 are connected to both ends of the resistor R3, and source and drain of a transistor MN3 are connected to both ends of the resistor R4. Hereinafter, the resistors R0, R1, R2, R3, R4, when generically referred to, are expressed as resistors R. Also, the transistors MN0-MN3, when generically referred to, are expressed as transistors MN.

In addition, in this invention, the number of resistors R and transistors MN for adjustment use included in the element array 14 is not limited to four each, and may be set as appropriate depending on the degree of circuit-constant correction in the operation circuit 15.

Also, a resistor selection terminal DATA[0] is connected to gate of the transistor MN0. For the rest, similarly, a resistor selection terminal DATA[1] is connected to gate of the transistor MN1, a resistor selection terminal DATA[2] is connected to gate of the transistor MN2, and a resistor selection terminal DATA[3] is connected to gate of the transistor MN3.

Figure 3:
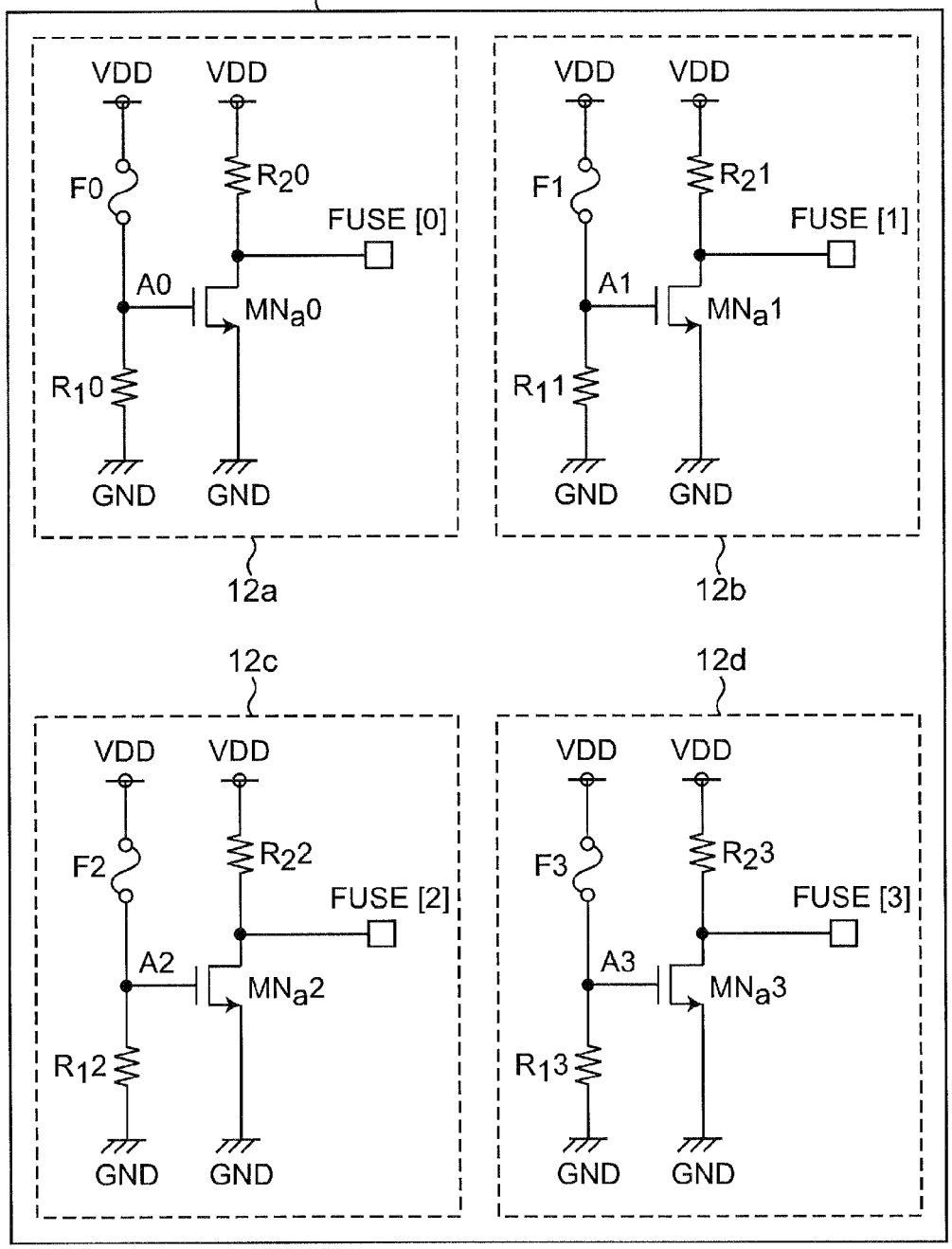
FIG. 3 is a concrete circuit diagram of the trimming information generation circuit of FIG. 1.

FIG. 3 shows a specific circuit diagram of the trimming information generation circuit 12. The trimming information generation circuit 12 has internal circuits 12a-12d provided for individual trimming signal terminals FUSE[0]-FUSE[3], respectively. Then, the internal circuit 12a is comprised of a fuse F0 connected between an output node A0 and power supply voltage VDD, a pull-down resistor $R_1 0$ connected between the output node A0 and ground potential GND, a transistor $MN_a 0$ having its gate connected to the output node A0 and its source connected to the ground potential GND and its drain connected to the trimming signal terminal FUSE[0], and a pull-up resistor $R_2 0$ connected between the trimming signal terminal FUSE[0] and the power supply voltage VDD. Further, the internal circuits 12b-12d are provided in correspondence to the trimming signal terminals FUSE[1]-FUSE[3], respectively, and being absolutely identical in structure to the internal circuit 12a.

In this case, the resistance value of the fuses F0-F3 is several hundreds $\Omega$ or less, and the resistance value of the pull-down resistors $R_1 0$-$R_1 3$ is a few k$\Omega$-several tens k$\Omega$. Hereinafter, the fuses F0-F3, when generically referred to, are expressed as fuses F. Also, the trimming signal terminals FUSE[1]-FUSE[3], when generically referred to, are expressed as trimming signal terminals FUSE.

In the trimming information generation circuit 12 having the above-described construction, for example, when the fuse F2 of the internal circuit 12c is melted and cut, the resistance value between the output node A2 and the power supply voltage VDD becomes several hundreds kΩ or more, so that the potential of the output node A2 becomes equivalent to the ground potential GND. Then, the transistor $MN_a2$ turns off, and a trimming signal (of level 'H') of a potential equivalent to the power supply voltage VDD is outputted from the trimming signal terminal FUSE[2]. Meanwhile, on condition that the fuse F1 of the internal circuit 12b is not melted and cut, the resistance value between the output node A1 and the power supply voltage VDD becomes several hundreds Ω or less, so that the potential of the output node A1 becomes equivalent to the power supply voltage VDD. Then, the transistor $MN_a1$ turns on, and a trimming signal (of level 'L') of a potential equivalent to the ground potential GND is outputted from the trimming signal terminal FUSE[1].

In this way, trimming signals of level 'H' are outputted from trimming signal terminals FUSE corresponding to melted-and-cut fuses F, while trimming signals of level 'L' are outputted from trimming signal terminals FUSE corresponding to non-melted-and-cut fuses F.

Figure 9:
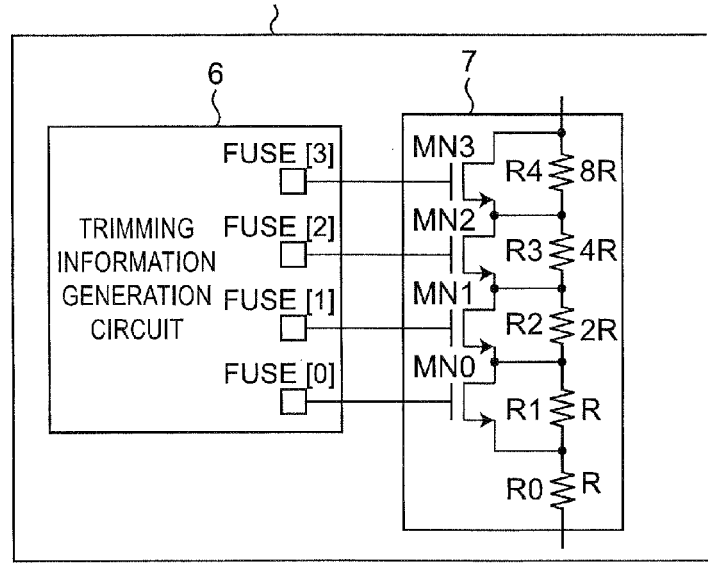
FIG. 9 is a view showing an outline of a semiconductor integrated circuit device including a trimming information generation circuit according to a prior art.
Figure 10:
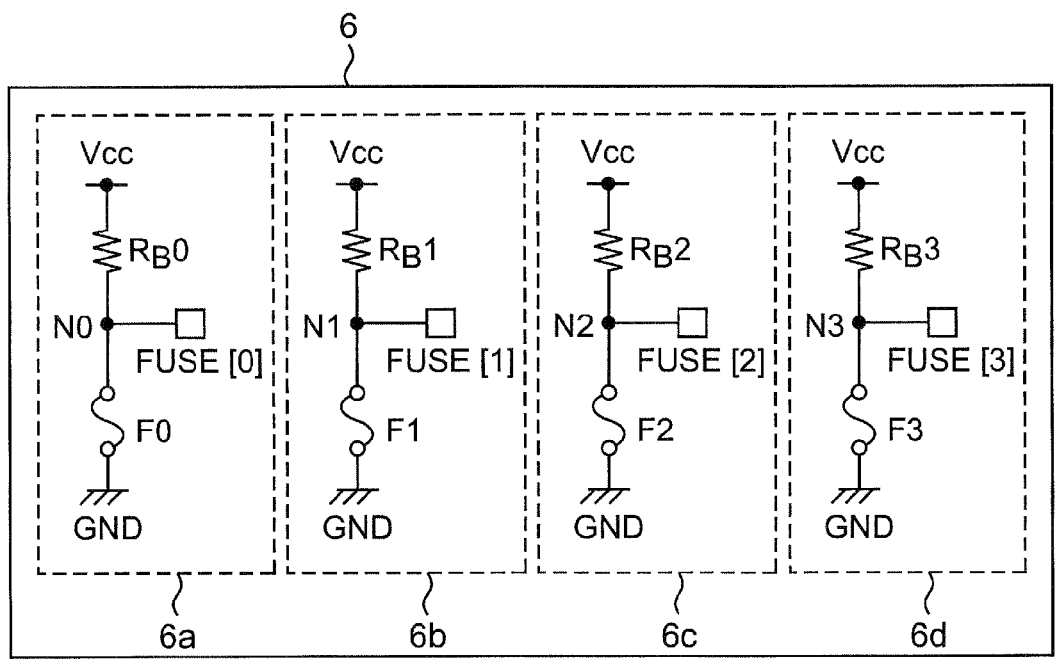
FIG. 10 is a view showing an example of the trimming information generation circuit of FIG. 9.

In this case, the structure of the element array 14 in this embodiment is absolutely identical to that of the variable resistor element 7 of the prior-art semiconductor integrated circuit device 5 shown in FIG. 9. Therefore, if trimming information generated by the trimming information generation circuit 12 as described above is inputted, as it is, to the resistor selection terminals DATA[0]-DATA[3] of the element array 14, the same relationship between distribution of a "certain characteristic value" and number of melted-and-cut fuses as that of FIGS. 11A-11E can be obtained. Thus, it is impossible to lessen the number of melted-and-cut fuses that fall within the range of "mean value±2σ" in the distribution of the characteristic value.

Figure 11:
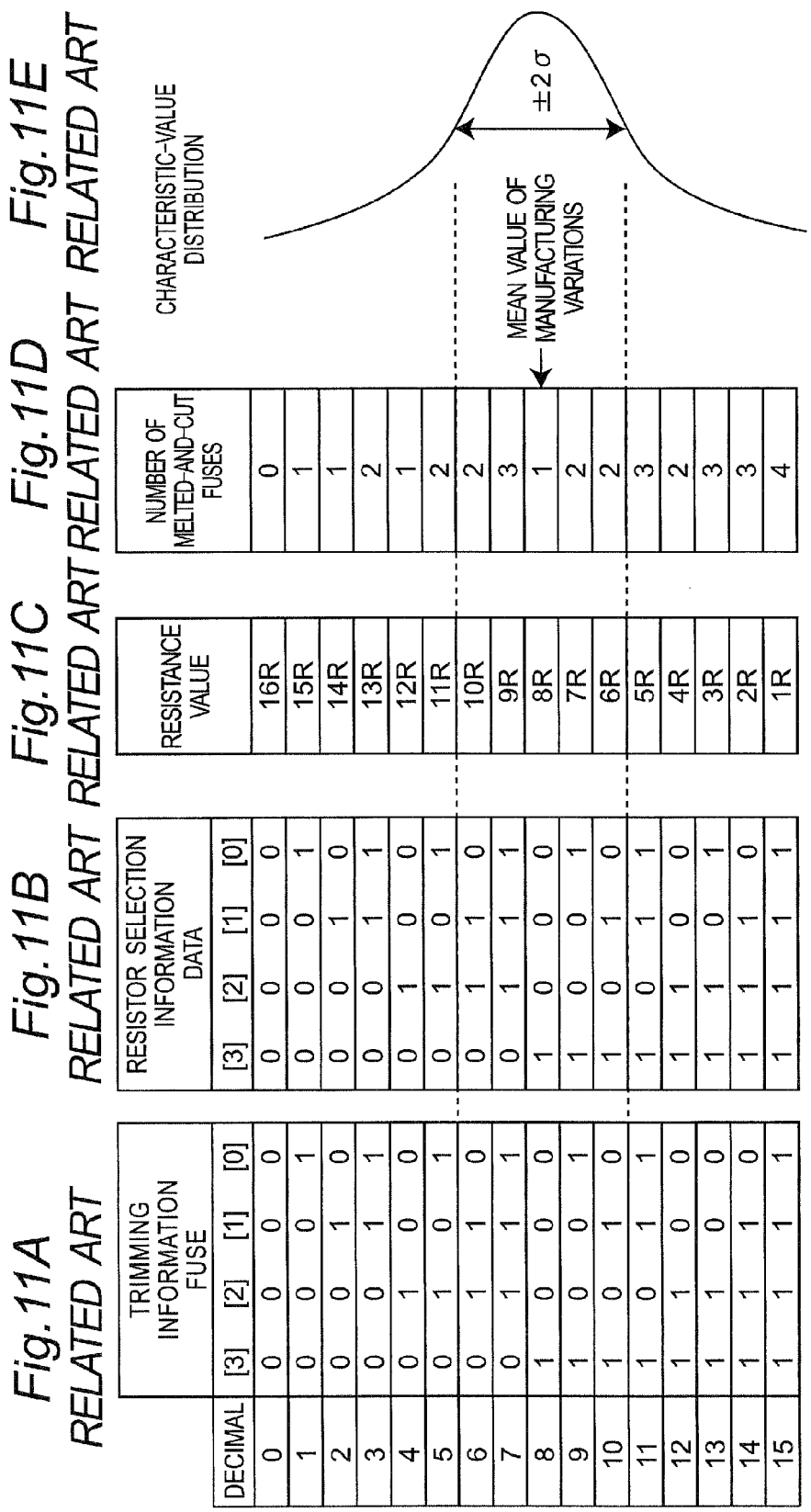
FIGS. 11A-11E are views showing trimming information, resistor selection information, combined resistance values of the resistors R, numbers of melted-and-cut fuses, and a distribution of a certain characteristic value in FIG. 9.

Now, as can be seen from FIGS. 11A-11E, the 'mean value' in the distribution of a characteristic value is positioned at a generally center '8R' of combined resistance values arrayed in a descending order in FIG. 11C. Also, the range of "mean value±2σ" in the characteristic-value distribution is positioned over a range of five resistance values "10R, 9R, 8R, 7R, 6R," where '8R' is at a generally center of the combined resistance values arrayed in a descending order in FIG. 11C. In this case, the trimming information formed of a 4-bit bit string (least significant bit corresponds to trimming signal terminal FUSE[0]) shown in FIG. 11A shows that the lowest-order three bits are identical between smaller resistance value side and larger resistance value side, where a border of the two sides is a boundary between the resistance values '9R' and '8R.' That is, given that 4-bit trimming information is expressed in decimal number, the number of bit value '1's in the lowest-order three bits generally increases in a direction from trimming information '0' toward trimming information '7.' Similarly, the number of bit value '1's in the lowest-order three bits generally increases in a direction from trimming information '8' toward trimming information '15.' It is noted that the number of bit value '1's in trimming information expressed in binary number represents the number of melted-and-cut fuses.

That is, in FIGS. 11A-11E, it is trimming information pieces '6' and '7' expressed in decimal number that correspond to combined resistance values '9R' and '10R' in FIG. 11C. Therefore, a large number of bit value '1's of the lowest-order three bits are included in the trimming information expressed in binary number in the combined resistance values '9R' and '10R,' resultantly involving large numbers of melted-and-cut fuses such as '3' and '2' fuses.

Thus, in order to decrease the number of melted-and-cut fuses in the combined resistance values '9R' and '10R,' trimming information pieces corresponding to combined resistance values '16R' to '9R' may be arrayed in a descending order from the trimming information pieces '7' to '0' as expressed in decimal number. By doing so, as to the numbers of melted-and-cut fuses for the combined resistance values '9R' and '10R,' since corresponding trimming information pieces (decimal number) become '1' and '0,' the numbers of melted-and-cut fuses can be decreased to '1' fuse and '0' fuses.

In the above description, attention has been focused only on the lowest-order three bits in 4-bit trimming information. However, the trimming information is actually 4-bit information. Then, as described before, in the case where trimming information pieces corresponding to the combined resistance values '16R' to '9R' are arrayed in the descending order from '7' to '0' in decimal number while trimming information pieces corresponding to the combined resistance values '8R' to '1R' are arrayed in the ascending order from '8' to '15' in decimal number, three trimming information pieces in which the bit value of the most significant bit is '1' (i.e., trimming information expressed in decimal number is '8' or more) are included in five trimming information pieces corresponding to five resistance values "10R-6R," which are the range "mean value±2σ" in the characteristic-value distribution, causing the number of melted-and-cut fuses to be proportionally increased by three.

Now, changes are made on the above-case array of trimming information, in which "trimming information pieces corresponding to the combined resistance values '16R' to '9R' are arrayed in the descending order from '7' to '0' in decimal number while trimming information pieces corresponding to the combined resistance values '8R' to '1R' are arrayed in the ascending order from '8' to '15' in decimal number," so that the arrays are switched over between the smaller resistance value side and the larger resistance value side with the boundary of the combined resistance values '9R' and '8R' taken as their border, and the switched-over arrays are changed to the ascending order on the smaller resistance value side and to the descending order on the larger resistance value side.

That is, the array of trimming information pieces corresponding to the combined resistance values '16R' to '9R' is changed into a descending order from '15' to '8' in decimal number, while the array of trimming information pieces corresponding to the combined resistance values '8R' to '1R' is changed into an ascending order from '0' to '7' in decimal number. By doing so, only two trimming information pieces in which the bit value of the most significant bit is '1' (i.e., trimming information expressed in decimal number is '8' or more) are included in five trimming information pieces corresponding to five resistance values "10R-6R," which are the range "mean value±2σ" in the characteristic-value distribution, allowing the number of melted-and-cut fuses to be decreased from above-mentioned three to two fuses. As a result, the number of melted-and-cut fuses is five in total for the five resistance values "10R-6R," which are the range "mean value±2σ" in the characteristic-value distribution, hence a large decrease from ten fuses of the prior-art semiconductor integrated circuit device 5 shown in FIGS. 11A-11E.

Here is given an assumption that a relationship between a distribution of one "characteristic value" based on the circuit constant of the semiconductor integrated circuit 11 and combined resistance values as the combined physical-property values of the element array 14 in this embodiment is the same as a relationship between the "CHARACTERISTIC-VALUE" distribution shown in FIG. 11E and the combined resistance values shown in FIG. 11C in the prior-art semiconductor integrated circuit device 5. In this case, resistor selection information as the element selection information in this embodiment needs to be arrayed in the same manner as the resistor selection information shown in FIG. 11B.

Therefore, in this embodiment, a conversion circuit 13 is provided between the trimming information generation circuit 12 and the element array 14. Further, the arraying order of trimming information outputted from the trimming information generation circuit 12 is set to an arraying order for lessening the number of melted-and-cut fuses in the range of "mean value±2σ" in the characteristic-value appearance frequency distribution discussed as described above. Then, by the conversion circuit 13, the trimming information "that has been so set that the number of melted-and-cut fuses in the range of "mean value±2σ" in the characteristic-value distribution are lessened" outputted from the trimming information generation circuit 12 is converted into the resistor selection information in which the arraying order of the combined resistance values becomes identical to the arraying order shown in FIG. 11C.

Figure 5:
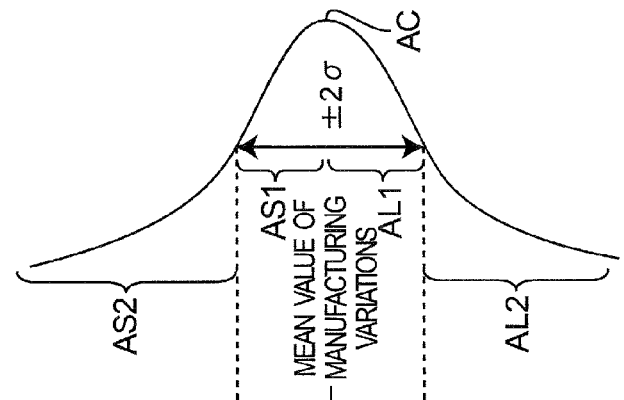
FIGS. 5A-5E are views showing trimming information, resistor selection information, combined resistance values of the resistors R, numbers of melted-and-cut fuses, and a distribution of a certain characteristic value.

FIGS. 5A-5E show: 4-bit trimming information IL2, IL1, IC0, IS1, IS2 (least significant bit corresponds to trimming signal terminal FUSE[0]) simultaneously outputted from the trimming signal terminals FUSE[0]-FUSE[3] to select resistors that are short-circuited and nullified from the resistor array in the element array 14 (FIG. 5A); 4-bit resistor selection information (least significant bit corresponds to resistor selection terminal DATA[0]) simultaneously outputted from resistor selection terminals DATA[0]-DATA[3] (FIG. 5B); combined resistance values of the resistors R0-R4 (FIG. 5C); numbers of melted-and-cut fuses (FIG. 5D); and an appearance frequency distribution of the characteristic value based on the circuit constant of the obtained semiconductor integrated circuit 11 (FIG. 5E).

Herein, in the trimming information, a '1' stands for a trimming signal of level 'H,' i.e. for a melted-and-cut fuse, while a '0' stands for a trimming signal of level 'L,' i.e. for a non-melted-and-cut fuse. Further, in the resistor selection information, a '1' stands for a resistor selection signal of level 'H,' i.e. for turn-on of a transistor MN, while a '0' stands for a resistor selection signal of level 'L,' i.e. for turn-off of a transistor MN.

In addition, the resistor selection information shown in FIG. 5B, the combined resistance values shown in FIG. 5C, the numbers of melted-and-cut fuses shown in FIG. 5D, and the characteristic-value distribution shown in FIG. 5E are absolutely identical to the resistor selection information shown in FIG. 11B, the combined resistance values shown in FIG. 11C, the numbers of melted-and-cut fuses shown in FIG. 11D, and the characteristic-value distribution shown in FIG. 11E, respectively.

Also, the arraying order of trimming information shown in FIG. 5A is set to an arraying order for lessening the number of melted-and-cut fuses in the range of "mean value±2σ" in the characteristic-value distribution (FIG. 5E) discussed as described above. That is, the arraying order of trimming information IS2, IS1 corresponding to the combined resistance values '16R' to '9R' is set to a descending order from '15' to '8' in decimal number, and the arraying order of trimming information IC0, IL1, IL2 corresponding to the combined resistance values '8R' to '1R' is set to an ascending order from '0,' which is the least number of fuses, to '7' in decimal number.

Consequently, in the five trimming information pieces (included in IC0, IS1, IL1) corresponding to the range AS1, AL1 of "mean value±2σ" in the characteristic-value distribution, the number of melted-and-cut fuses is five in total. In the trimming information corresponding to the "mean value," which shows a particularly large appearance number in the characteristic-value distribution, the number of melted-and-cut fuses is zero fuses.

Figure 4:
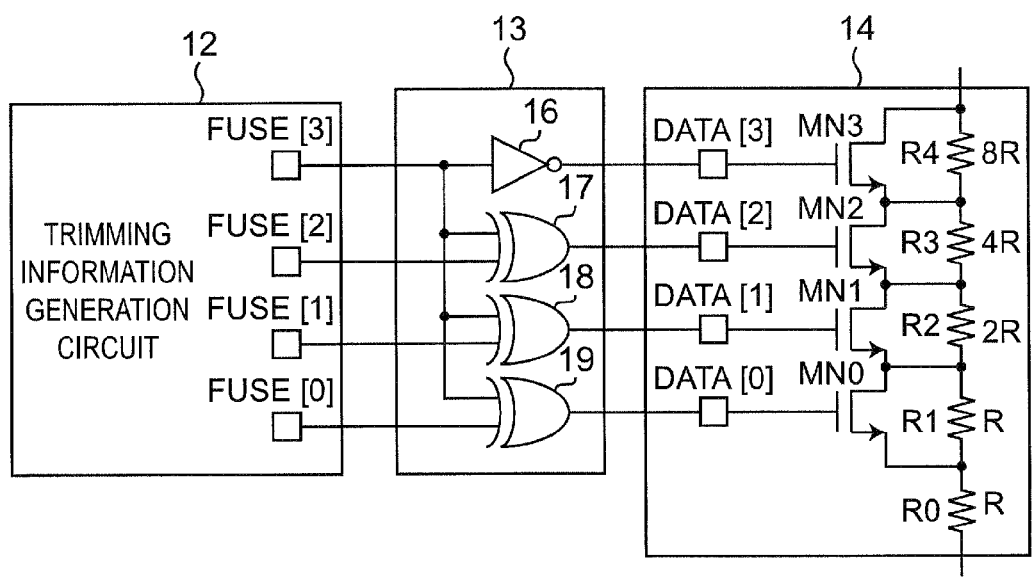
FIG. 4 is a concrete circuit diagram of the conversion circuit of FIG. 1.

FIG. 4 shows a specific circuit diagram of the conversion circuit 13. In a comparison between the trimming information shown in FIG. 5A and the resistor selection information shown in FIG. 5B, the most significant bit of the resistor selection information is an inversion of bit data of the most significant bit of the trimming information. Therefore, a NOT gate 16 is used as an element for connecting the trimming signal terminal FUSE[3] and the resistor selection terminal DATA[3] to each other in the conversion circuit 13. Also, given that the most significant bit of the trimming information is '1,' the lowest-order three bits of the resistor selection information are an inversion of bit data of the lowest-order three bits of the trimming information, while given that the most significant bit of the trimming information is '0,' the lowest-order three bits of the resistor selection information are bit data of the lowest-order three bits of the trimming information. Thus, exclusive-OR gates 17-19 whose inputs are given by trimming signals from one of the trimming signal terminals FUSE[0]-FUSE[2] and the trimming signal terminal FUSE[3] are used as elements to be connected to the resistor selection terminals DATA[0]-DATA[2] in the conversion circuit 13.

In this embodiment, the relationship between the characteristic-value appearance frequency distribution of the obtained semiconductor integrated circuit 11 and combined resistance values of the resistors R0-R4 in the element array 14 is set as shown in FIGS. 5A-5E. However, the relationship is not necessarily such a relationship as shown in FIGS. 5A-5E. For example, there are some cases where the mean value AC of the appearance frequency distribution is shifted from the combined resistance value 8R toward the smaller resistance value side or the larger resistance value side. In such a case, it is appropriate to shift a position of the boundary between a region of the decreasing-order array and a region of the increasing-order array for the trimming information, according to the shift.

Also in this embodiment, the number of adjustment-use resistors R and transistors MN included in the element array 14 is set to four, but is not limited to four. For example, with the number set to five each, it is appropriate that the trimming information and the resistor selection information are provided as 5-bit information each and that $2^5$ combined resistance values are obtained in combinations of the five resistors R.

As described above, in this embodiment, the semiconductor integrated circuit 11 is comprised of: a trimming information generation circuit 12 for generating trimming signals representing whether or not four fuses F0-F3 have been melted and cut and then outputting 4-bit trimming information representing the trimming signals for all the fuses F; a conversion circuit 13 for converting a bit string of the trimming information into element selection information formed of a bit string for element selection; an element array 14 for selectively turning off part of the built-in element array according to the element selection information; and an operation circuit 15 for correcting a circuit constant based on an output of the element array.

Then, 4-bit trimming information simultaneously outputted from the trimming signal terminals FUSE[0]-FUSE[3] in the trimming information generation circuit 12 is set as follows.

First, a median (in this embodiment, '8R') of a plurality of combined resistance values obtained by combinations of variously selected resistors R in the element array 14 is associated with a mean value AC in the characteristic-value appearance frequency distribution shown in FIG. 5E. Further, for combined resistance values showing values smaller than the median, characteristic values AL1, AL2 larger than the mean value AC are associated so that the characteristic values increase along with decreases of the combined resistance values. Moreover, for combined resistance values showing values larger than the median, characteristic values AS1, AS2 smaller than the mean value AC are associated so that the characteristic values decrease along with increases of the combined resistance values.

Next, to the semiconductor integrated circuit 11 in which the characteristic value before correction shows a mean value AC in the appearance frequency distribution shown in FIG. 5E, trimming information IC0 [0,0,0,0] ('0' as expressed in decimal number) representing that all the fuses F are non-melted-and-cut is assigned as trimming information for correcting the circuit constant of the operation circuit 15.

Next, as trimming information for the semiconductor integrated circuit 11 in which the characteristic value before correction falls within either one (AL1 in this embodiment) of a range over the "mean value" and under the "mean value+$2\sigma$" or a range under the "mean value" and over the "mean value−$2\sigma$" in the appearance frequency distribution shown in FIG. 5E, trimming information (IL1 representing '1,' '2' in decimal number) continuously succeeding the trimming information IC0 [0,0,0,0] ('0' in decimal number) assigned to the semiconductor integrated circuit 11 showing the mean value AC is assigned in an ascending order along with increases of the deviation.

Next, as trimming information for the semiconductor integrated circuit 11 in which the characteristic value before correction falls within the other one (AS1 in this embodiment) of the range over the "mean value" and under the "mean value+$2\sigma$" or the range under the "mean value" and over the "mean value−$2\sigma$" in the appearance frequency distribution shown in FIG. 5E, trimming information (IS1 representing '8,' '9' in decimal number in this embodiment) resulting from inverting to '1' the most significant bit of the trimming information (IL1 in this embodiment) assigned to the semiconductor integrated circuit 11 in which the characteristic value before correction shows the "mean value" and to the semiconductor integrated circuit 11 in which the characteristic value before correction falls within the either one (AL1 in this embodiment) of the range over the "mean value" and under the "mean value+$2\sigma$" or the range under the "mean value" and over the "mean value−$2\sigma$" is assigned in an ascending order along with increases of the deviation.

Next, as trimming information for the semiconductor integrated circuit 11 in which the characteristic value before correction falls in one side (AL2 in this embodiment) in which the deviation is larger than the either one (AL1 in this embodiment) of "mean value+$2\sigma$" and "mean value−$2\sigma$" in the appearance frequency distribution shown in FIG. 5E, trimming information (IL2 representing '3'-'7' in decimal number in this embodiment) that further continuously succeeds trimming information (IL1 in this embodiment) continuously succeeding the trimming information IC0 assigned to the semiconductor integrated circuit 11 in which the characteristic value shows the mean value is assigned in an ascending order along with increases of the deviation.

Further, as trimming information for the semiconductor integrated circuit 11 in which the characteristic value before correction falls in one side (AS2 in this embodiment) in which the deviation is larger than the other one (AS1 in this embodiment) of "mean value+$2\sigma$" and "mean value−$2\sigma$" in the appearance frequency distribution shown in FIG. 5E, trimming information (IS2 representing '10'-'15' in decimal number in this embodiment) continuously succeeding the trimming information (IS1 in this embodiment) whose most significant bit is inverted to '1' is assigned in an ascending order along with increases of the deviation.

It is noted that trimming information outputted from the trimming information generation circuit 12, to which the trimming information has been assigned as shown above, is information as to melt-and-cut of fuses F, and not resistor selection information for designating elements (resistors R) to be turned off in the element array 14.

Therefore, by the conversion circuit 13, a bit string of trimming information outputted from the trimming information generation circuit 12 is converted into resistor selection information formed of a bit string for selection of the elements (resistors R).

The conversion of the trimming information into the resistor selection information in this case is fulfilled as follows.

Trimming information IC0 [0,0,0,0] ('0' in decimal number) representing that all the fuses F are non-melted-and-cut is converted into the resistor selection information that allows selection of such a combination of resistors R that the combined resistance value of the resistors R becomes a median ('8R' in this embodiment) of the plural combined resistance values;

Trimming information (IL1 representing '1,' '2' in decimal number in this embodiment) continuously succeeding the trimming information IC0 [0,0,0,0] ('0' in decimal number) is converted into the resistor selection information that allows selection of a combination of resistors R so that the trimming information can correspond to combined resistance values ('7R,' '6R' in this embodiment) associated according to deviations with the either one (AL1 in this embodiment) of the range over the "mean value" and under "mean value+$2\sigma$" or the range under the "mean value" and over "mean value−$2\sigma$" in the appearance frequency distribution of the characteristic value before correction;

Trimming information representing that all the fuses F are non-melted-and-cut and trimming information which continuously succeeds the trimming information and whose most significant bit is inverted to '1' (IS1 representing '8,' '9' in decimal number in this embodiment) are converted into the resistor selection information that allows selection of a combination of resistors R so that the trimming information can correspond to combined resistance values ('9R,' '10R' in this embodiment) associated according to deviations with the other one (AS1 in this embodiment) of the range over the "mean value" and under "mean value+$2\sigma$" or the range under the "mean value" and over "mean value−$2\sigma$" in the appearance frequency distribution of the characteristic value before correction.

Trimming information representing that all the fuses F are non-melted-and-cut and trimming information which further continuously succeeds trimming information continuously succeeding the trimming information (IL2 representing '3'-'7' in decimal number in this embodiment) are converted into the resistor selection information that allows selection of a combination of resistors R so that the trimming information can correspond to combined resistance values ('5R'-'1R' in this embodiment) associated according to deviations with one side (AL2 in this embodiment) in which the deviation is larger than the either one (AL1 in this embodiment) of the ranges "mean value+2σ" and "mean value−2σ" in the appearance frequency distribution of the characteristic value before correction.

Further, trimming information continuously succeeding trimming information whose most significant bit is inverted to '1' (IS2 representing '10'-'15' in decimal number in this embodiment) is converted into the resistor selection information that allows selection of a combination of resistors R so that the trimming information can correspond to become combined resistance values ('11R'-'16R' in this embodiment) associated according to deviations with one side (AS2 in this embodiment) in which the deviation is larger than the other one (AS1 in this embodiment) of the ranges "mean value+2σ" and "mean value−2σ" in the appearance frequency distribution of the characteristic value before correction.

Assignment of trimming information from the trimming information generation circuit 12 for the semiconductor integrated circuit 11 in which the characteristic value before correction falls within the range of "mean value±2σ" in the appearance frequency distribution of the characteristic value is fulfilled as described above. Then, by the conversion circuit 13, trimming information IS1, IC0, IL1 for the semiconductor integrated circuit 11 in which the characteristic value falls within the range AS1, AC0, AL1 of "mean value±2σ" in the appearance frequency distribution of the characteristic value is converted into the resistor selection information that allows selection of such a combination of resistors R so that the combined resistance values of the resistors R can become combined resistance values associated with the characteristic value falling within the range of "mean value±2σ" in the appearance frequency distribution. As a result, the number of melted-and-cut fuses for generation of trimming information for the semiconductor integrated circuit 11 in which the characteristic value before correction falls within the range of "mean value±2σ" in the appearance frequency distribution of the characteristic value can be reduced to a large extent, as compared with the case of the semiconductor integrated circuit device 5 shown in FIG. 9.

Thus, damage to the semiconductor due to melt-and-cut of the fuses F in trimming process can be lessened, so that adverse effects on the quality of the semiconductor integrated circuit 11 can be suppressed.

In particular, trimming information IC0 representing that all the fuses F are non-melted-and-cut is assigned as trimming information for the semiconductor integrated circuit 11 in which the characteristic value before correction is a mean value showing larger numbers of appearance in the appearance frequency distribution of the characteristic value. Therefore, in trimming process for many semiconductor integrated circuits 11 in which "the characteristic value before correction shows the mean value in the characteristic-value distribution," there is no need for melting and cutting all the fuses F, so that adverse effects on the quality of the semiconductor integrated circuit 11 can be prevented.

Second Embodiment

In the first embodiment, as described above, correspondence between the combined resistance values of resistors R shown in FIG. 5C and the trimming information shown in FIG. 5A is fulfilled by setting the array of trimming information corresponding to the combined resistance values '16R' to '9R' into a descending order from '15' to '8' in decimal number. Meanwhile, the array of trimming information corresponding to the combined resistance values '8R' to '1R' is set into an ascending order from '0' to '7' in decimal number.

In this case, as can be seen from FIG. 5D, the number of melted-and-cut fuses does not simply increase in response to increases in deviation from '0' fuses corresponding to the mean value in the appearance frequency distribution shown in FIG. 5E. The number of melted-and-cut fuses once decreases as from '3' to '2' fuses in the minus side of deviation and as from '2' to '1' fuses in the plus side of deviation.

From a viewpoint of lessening the number of melted-and-cut fuses, it is desirable that the higher the appearance frequency in the appearance frequency distribution shown in FIG. 5E is, the smaller the number of melted-and-cut fuses is, and that the number of melted-and-cut fuses increases with decreasing appearance frequency.

Therefore, in this embodiment, the trimming information is so set that the higher the appearance frequency in the appearance frequency distribution shown in FIG. 5E is, the smaller the number of melted-and-cut fuses is, and that the number of melted-and-cut fuses increases with decreasing appearance frequency.

An outlined structure of the semiconductor integrated circuit in this embodiment includes a trimming information generation circuit 12, a conversion circuit 13, an element array 14 and an operation circuit 15, as in the outlined structure of the first embodiment shown in FIG. 1. Also, a specific circuit of the element array 14 is the same as the circuit diagram shown in FIG. 2 in the first embodiment. A specific circuit of the trimming information generation circuit 12 is the same as the circuit diagram shown in FIG. 3 in the first embodiment.

Figure 6:
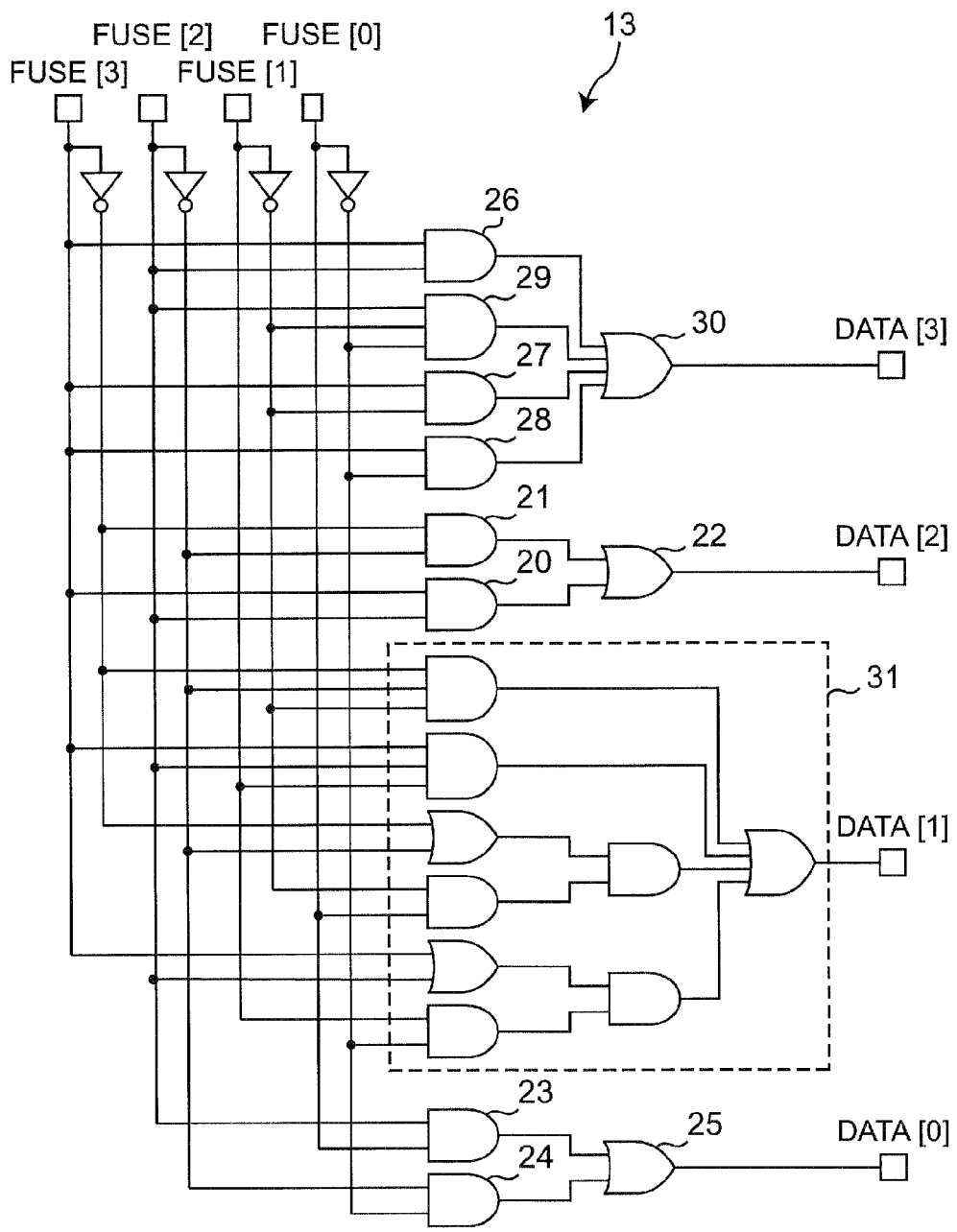
FIG. 6 is a concrete circuit diagram of a conversion circuit different from that of FIG. 4.
Figure 7:
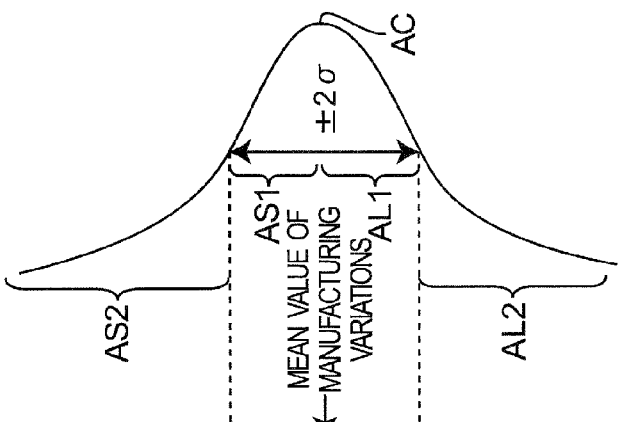
FIGS. 7A-7E are views showing trimming information, resistor selection information, combined resistance values of the resistors R, numbers of melted-and-cut fuses, and a distribution of a certain characteristic value all of which are different from those of FIGS. 5A-5E.
Figure 8:
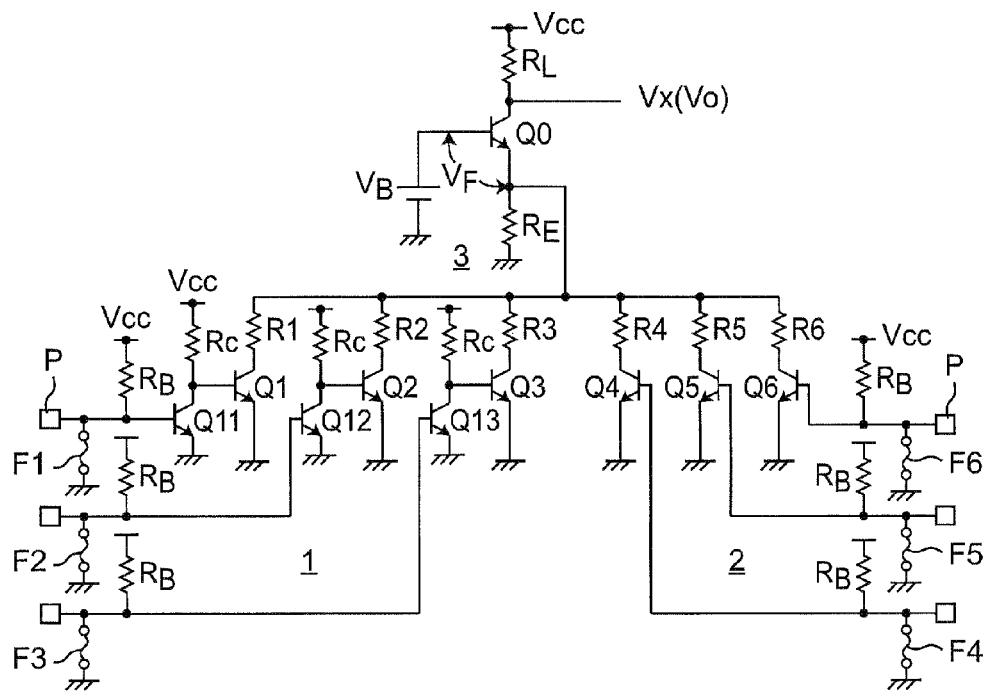
FIG. 8 is a view showing a semiconductor integrated circuit device including a trimming circuit according to a prior art.

FIG. 6 is a specific circuit diagram of a conversion circuit 13 in the semiconductor integrated circuit of this embodiment. FIGS. 7A-7E show: 4-bit trimming information IS2', IS1', IC0', IL1', IL2' (least significant bit corresponds to trimming signal terminal FUSE[0]) (FIG. 7A); 4-bit resistor selection information (least significant bit corresponds to resistor selection terminal DATA[0]) (FIG. 7B); combined resistance values of the resistors R0-R4 (FIG. 7C); numbers of melted-and-cut fuses (FIG. 7D); and a distribution of one characteristic value based on the circuit constant of the obtained semiconductor integrated circuit 11 (FIG. 7E).

Herein, in the trimming information, a '1' stands for a trimming signal of level 'FT,' i.e. for a melted-and-cut fuse, while a '0' stands for a trimming signal of level 'L,' i.e. for a non-melted-and-cut fuse. Further, in the resistor selection information, a '1' stands for a resistor selection signal of level 'H,' i.e. for turn-on of a transistor MN, while a '0' stands for a resistor selection signal of level 'L,' i.e. for turn-off of a transistor MN.

The characteristic-value distribution (FIG. 7E) in this embodiment is the same as the characteristic-value distribution (FIG. 5E) in the first embodiment. However, in this embodiment, a median of combined resistance values of the resistors R to be associated in correspondence to the mean value AC in the characteristic-value appearance frequency distribution is set to '9R.' Further, combined resistance values smaller than '9R' are associated with the minus side AS1, AS2 of deviation in the distribution, while combined resistance values larger than '9R' are associated with the plus side AL1, AL2 of deviation in the distribution. As a result, the arraying order of resistor selection information is, as shown in FIG. 7B, reverse to that shown in FIG. 5B in the first embodiment.

Also, in this trimming information, out of the trimming information shown in FIG. 5A in the first embodiment, trimming information at places where the number of melted-and-cut fuses do not continuously increase but once decrease along with increases in deviation in the appearance frequency distribution shown in FIG. 5E is moved to such positions where the number of melted-and-cut fuses can be increased along with increases in deviation.

That is, trimming information [1,0,1,1] ('11' in decimal number), which represents that the number of melted-and-cut fuses is '3,' out of the trimming information shown in FIG. 5A, as shown in FIG. 5D, is positioned between two trimming information pieces representing that the number of melted-and-cut fuses is '2.' Also, trimming information [0,1,0,0] ('4' in decimal number) representing that the number of melted-and-cut fuses is '1' is positioned between two trimming information pieces representing that the number of melted-and-cut fuses is '2.'

Therefore, in the trimming information of this embodiment, as shown in FIG. 7A, trimming information [1,0,1,1] ('11' in decimal number) in which the number of melted-and-cut fuses is '3' is moved to a position next succeeding the trimming information [0,1,1,1] ('7' in decimal number) in which the number of melted-and-cut fuses is '3.' Further, the trimming information [0,1,0,0] ('4' in decimal number) in which the number of melted-and-cut fuses is '1' is moved to a position next succeeding the trimming information IC0' [0,0,0,0] ('0' in decimal number) in which the number of melted-and-cut fuses is '0.'

As a result, the number of melted-and-cut fuses in this embodiment, as shown in FIG. 7D, simply increases from '0' fuses corresponding to the mean value AC in the appearance frequency distribution shown in FIG. 7E to '4' fuses in response to increases in deviation on the minus side AS1, AS2 of deviation. Also, the number of melted-and-cut fuses simply increases to '3' fuses in response to the increases in deviation on the plus side AL1, AL2 of deviation.

However, the trimming information, which is arrayed as '15, 14, 13, 12, 10, 9, 8, 4, 0, 1, 2, 3, 5, 6, 7, 11' in decimal number as shown in FIG. 7A, is somewhat other than simple array, as compared with the case of trimming information shown in FIG. 5A in the first embodiment.

Therefore, the specific circuit construction of the conversion circuit 13 for converting the trimming information shown in FIG. 7A into the resistor selection information shown in FIG. 7B is, as shown in FIG. 6, more complicated than the specific circuit construction shown in FIG. 4 in the first embodiment.

That is, in comparison between the trimming information shown in FIG. 7A and the resistor selection information shown in FIG. 7B, bit data of the third bit in the resistor selection information goes a '1' for identicalness between fourth-bit (most-significant-bit) bit data and third-bit bit data in the trimming information, and goes a '0' for differentness between those bit data. Accordingly, elements connected to the resistor selection terminal DATA[2] in the conversion circuit 13 are provided by using an AND gate 20 whose inputs are trimming signals from the trimming signal terminal FUSE[3] and the trimming signal terminal FUSE[2], an AND gate 21 whose inputs are an inverted signal of a trimming signal from the trimming signal terminal FUSE[3] and an inverted signal of a trimming signal from the trimming signal terminal FUSE[2], and an OR gate 22 whose inputs are output signals of the AND gate 20 and the AND gate 21.

Also, first-bit (least-significant-bit) bit data in the resistor selection information goes a '1' for identicalness between third-bit bit data and first-bit bit data in the trimming information, and goes a '0' for differentness between those bit data. Accordingly, elements connected to the resistor selection terminal DATA[0] in the conversion circuit 13 are provided by using an AND gate 23 whose inputs are trimming signals from the trimming signal terminal FUSE[2] and the trimming signal terminal FUSE[0], an AND gate 24 whose inputs are an inverted signal of a trimming signal from the trimming signal terminal FUSE[2] and an inverted signal of a trimming signal from the trimming signal terminal FUSE[0], and an OR gate 25 whose inputs are output signals of the AND gate 23 and the AND gate 24.

Also, fourth-bit (most-significant-bit) bit data in the resistor selection information basically goes a '1' for both 4-bit bit data and third-bit bit data in the trimming information being a '1,' and goes a '0' for either one of the bit data being a '0.' Accordingly, a main element connected to the resistor selection terminal DATA[3] in the conversion circuit 13 is provided by an AND gate 26 whose inputs are trimming signals from the trimming signal terminal FUSE[3] and the trimming signal terminal FUSE[2]. Used in addition to this are an AND gate 27 which outputs a '1' when bit data from the trimming signal terminal FUSE[3] is a '1' and bit data from the trimming signal terminal FUSE[1] is a '0,' an AND gate 28 which outputs a '1' when bit data from the trimming signal terminal FUSE[3] is a '1' and bit data from the trimming signal terminal FUSE[0] is a '0,' an AND gate 29 which outputs a '1' when bit data from the trimming signal terminal FUSE[2] is a '1' and bit data from the trimming signal terminal FUSE[0] is a '0,' and an OR gate 30 whose inputs are output signals from the AND gates 26-29.

Further, although not described in detail, elements connected to the resistor selection terminal DATA[1] in the conversion circuit 13 are similarly set as shown by a logic circuit 31.

According to this embodiment, the number of melted-and-cut fuses is four in total for the five resistance values "7R-11R," which are associated with the range "mean value±2σ" in the characteristic-value distribution shown in FIG. 7E, showing that a decrease from five fuses of the first embodiment shown in FIGS. 5A-5E can be achieved.

As described above, in this embodiment, trimming information set as in the above-described first embodiment is changed, as shown in FIGS. 7A and 7D, so that the higher the appearance frequency in the appearance frequency distribution shown in FIG. 7E is, the smaller the number of melted-and-cut fuses is, and that the number of melted-and-cut fuses simply increases with decreasing appearance frequency. Therefore, for generation of trimming information for designating resistors R to be turned off to the semiconductor integrated circuit 11 in which the characteristic value before correction falls within the range of "mean value±2σ" in the appearance frequency distribution of the characteristic value, it becomes possible to further reduce the number of melted-and-cut fuses F included in the trimming information generation circuit 12.

Also, for ranges other than the range of "mean value±2σ," it is set that the higher the appearance frequency is, the smaller the number of melted-and-cut fuses is. Therefore, it becomes implementable to reduce the total number of melted-and-cut fuses for correction of all of actually manufactured semiconductor integrated circuits 11.

In this embodiment, as described above, trimming information [1,0,1,1] ('11' in decimal number) in which the number of melted-and-cut fuses is '3' is positioned at a place next succeeding the trimming information [0,1,1,1] ('7' in decimal number) in which the number of melted-and-cut fuses is '3.' However, without being limited to this position, the position may be any one only if it is between trimming information pieces showing numbers of melted-and-cut fuses being '2' and '3,' respectively, or between two trimming information pieces both showing a number of melted-and-cut fuses being '3.' Also in the case of trimming information [0,1,0,0] ('4' in decimal number) in which the number of melted-and-cut fuses is '1,' similarly, the position may be any one only if it is between trimming information pieces showing numbers of melted-and-cut fuses being '0' and '1,' respectively, or between two trimming information pieces both showing a number of melted-and-cut fuses being '1.' However, it is desirable that as in this embodiment, the position is changed so as to cause the total number of melted-and-cut fuses to be decreased within the range of "mean value±2σ" in the characteristic-value distribution shown in FIG. 7E.

Further, in this invention, the specific circuit construction of the conversion circuit 13 is not limited to those shown in FIGS. 4 and G. In brief, the circuit construction has only to be capable of converting trimming information set as shown in FIG. 5A or FIG. 7A into resistor selection information set as shown in FIG. 5B or FIG. 7B.

Also, association of the combined resistance values of resistors R of the element array 14 with the characteristic-value distribution shown in FIG. 7E is not limited to the association shown in FIG. 7C, and an association similar to that of FIG. 5C may be applied.

As described hereinabove, according to the individual embodiments, for generation of trimming information to the semiconductor integrated circuit 11 in which the characteristic value before correction falls within the range of "mean value±2σ" in the appearance frequency distribution of the characteristic value, it becomes possible to reduce the number of melted-and-cut fuses F included in the trimming information generation circuit 12 to a large extent. As a result, damage to the semiconductor due to melt-and-cut of the fuses F in trimming process can be lessened, so that adverse effects on the quality of the semiconductor integrated circuit 11 can be suppressed.

Thus, the semiconductor integrated circuit 11 having the effects described above is applicable also to electronic equipment used in any field. In particular, the semiconductor integrated circuit, when used in optical sensor devices having suffered an issue of variations in light-reception sensitivity characteristic or variations in light-emission intensity characteristic, can suppress occurrence of defective products by suppressing variations in the above characteristics without impairing the quality, thus allowing a cost reduction to be achieved.

Figure 12:
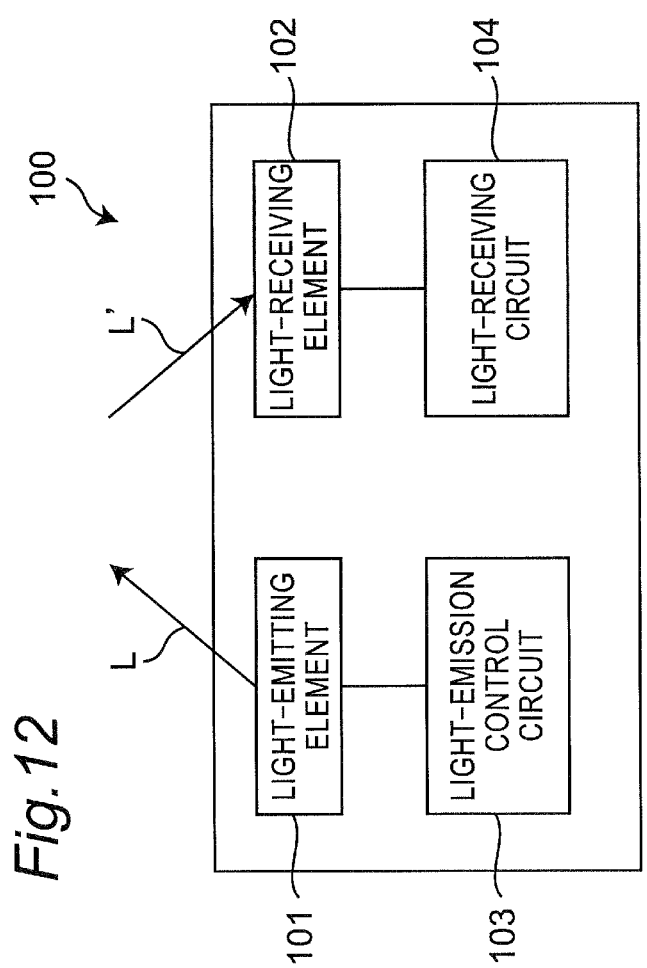
FIG. 12 is a view showing a block diagram of an embodiment of optical sensor device according to the invention.

That is, the optical sensor device 100 shown in FIG. 12 has a light-emitting element 101 for converting an electrical signal into an optical signal L as well as a light-receiving element 102 for converting a light-reception signal L' into an electrical signal. Then, the light-emitting element 101 is controlled by a light-emission control circuit 103 so as to exert light emission L, while the electrical signal from the light-receiving element 102 is amplified by a light-receiving circuit 104. Thus, the semiconductor integrated circuit 11 is mounted on at least either one of the light-emission control circuit 103 or the light-receiving-circuit 104. In such a case, the operation circuit 15 in the semiconductor integrated circuit 11 forms part of the light-emission control circuit 103 and the light-receiving circuit 104. Alternatively, the semiconductor integrated circuit 11 itself may constitute the light-emission control circuit 103 or the light-receiving circuit 104.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor integrated circuit comprising:
an operation circuit having a circuit constant and performing an operation corresponding to the circuit constant;
an element array which contains a plurality of arrayed elements and which selectively turns off part of the elements according to element selection information to correct the circuit constant of the operation circuit based on an output of the plurality of elements;
a trimming information generation circuit which contains a plurality of fuses and which generates and outputs trimming information in which whether or not each of the plurality of fuses has been melted and cut is represented by a bit string associated with the individual fuses; and
a conversion circuit for converting a bit string of the trimming information outputted from the trimming information generation circuit into the element selection information in which whether or not each of the plurality of fuses is turned off is represented by a bit string associated with the individual elements, wherein
as the trimming information for a case where a characteristic value of the operation circuit is a mean value in an appearance frequency distribution of the characteristic value, trimming information representing that a number of melted-and-cut fuses contained in the trimming information generation circuit is a least possible number is assigned, and
as the trimming information for cases where the characteristic value falls within a range of {mean value±2×(standard deviation)} in the appearance frequency distribution, trimming information representing that the number of melted-and-cut fuses contained in the trimming information generation circuit is a second least number next to the least number is assigned.

2. The semiconductor integrated circuit as claimed in claim 1, wherein
the plurality of elements contained in the element array are arrayed in series,
a median resulting when a plurality of combined physical-property values obtained by a combination of non-turned-off elements in the element array are arrayed in an ascending order or descending order is associated with the mean value of the appearance frequency distribution, and moreover each physical-property value smaller or larger in value than the median is associated with the characteristic value smaller than the mean value of the appearance frequency distribution according to a deviation of the appearance frequency distribution, while each physical-property value larger or smaller in value than the median is associated with the characteristic values larger than the mean value of the appearance frequency distribution according to a deviation of the appearance frequency distribution, and
the conversion by the conversion circuit is fulfilled by:
converting trimming information, which represents that the number of melted-and-cut fuses is the least possible number, into the element selection information that allows selection of a combination of the turned-off elements so that the trimming information can correspond to a median of the plurality of combined physical-property values, and converting trimming information, which represents that the number of melted-and-cut fuses is a second least number next to the least possible number, into the element selection information that allows selection of a combination of the turned-off elements so that the trimming information can correspond to the combined physical-property value associated with the characteristic value, which falls within the range of {the mean value±2×(standard deviation)} in the appearance frequency distribution, according to a deviation of the appearance frequency distribution.

3. The semiconductor integrated circuit as claimed in claim 1, wherein
the assignment of trimming information outputted from the trimming information generation circuit is fulfilled by:
as the trimming information for a case where the characteristic value is a mean value in the appearance frequency distribution, assigning trimming information representing that the number of melted-and-cut fuses contained in the trimming information generation circuit is 0,
as the trimming information for cases where the characteristic value falls within either one of a range from the mean value to {the mean value+2×(standard deviation)} and a range from the mean value to {the mean value−2× (standard deviation)} in the appearance frequency distribution, assigning trimming information continuously succeeding the trimming information assigned as trimming information for the case of the mean value, and
as the trimming information for cases where the characteristic value falls within the other one of a range from the mean value to {the mean value+2×(standard deviation)} and a range from the mean value to {the mean value−2× (standard deviation)} in the appearance frequency distribution, assigning trimming information obtained by inverting a most significant bit of trimming information assigned to the trimming information for the case of the mean value as well as to the trimming information for the case where the characteristic value falls within the either one of the range from the mean value to {the mean value+2×(standard deviation)} and the range from the mean value to {the mean value−2×(standard deviation)}.

4. The semiconductor integrated circuit as claimed in claim 3, wherein
the conversion by the conversion circuit is fulfilled by:
converting trimming information, which represents that the number of melted-and-cut fuses contained in the trimming information generation circuit is 0, into the element selection information that allows selection of a combination of the turned-off elements so that a combined physical-property value of the elements in the element array can become a median of the plurality of combined physical-property values,
converting trimming information, which continuously succeeds trimming information representing that the number of melted-and-cut fuses is 0, into the element selection information that allows selection of a combination of the turned-off elements so that the trimming information can correspond to the combined physical-property value associated with the either one of the range from the mean value to {the mean value+2×(standard deviation)} and the range from the mean value to {the mean value−2×(standard deviation)} in the appearance frequency distribution, according to the deviation, and
converting trimming information, which is obtained by inverting a most significant bit of trimming information representing that the number of melted-and-cut fuses is 0 and trimming information continuously succeeds the trimming information, into the element selection information that allows selection of a combination of the turned-off elements so that the trimming information can correspond to the combined physical-property value associated with the other one of the range from the mean value to {the mean value+2×(standard deviation)} and the range from the mean value to {the mean value−2× (standard deviation)} in the appearance frequency distribution, according to the deviation.

5. The semiconductor integrated circuit as claimed in claim 4, wherein
the conversion circuit comprises:
a NOT gate for inverting bit data of most-significant-bit of the trimming information and outputting the resulting data as bit data of the most significant bit of the element selection information; and
a plurality of exclusive-OR gates for receiving inputs of bit data of any one bit lower in order than the most significant bit in the trimming information as well as bit data of the most significant bit in the trimming information, and outputting bit data of any one bit lower in order than the most significant bit of the element selection information.

6. The semiconductor integrated circuit as claimed in claim 1, wherein
after the assignment of the trimming information outputted from the trimming information generation circuit is performed, reassignment of the trimming information is performed so that the higher the appearance frequency in the appearance frequency distribution is, the smaller the number of melted-and-cut fuses is, and that the number of melted-and-cut fuses simply increases with decreasing appearance frequency, and
the conversion circuit performs the conversion of the trimming information subjected to the reassignment.

7. An optical sensor device comprising:
a light-emitting element and a light-receiving element;
a light-emission control circuit for controlling the light-emitting element to emit light; and
a light-receiving circuit for amplifying an electrical signal from the light-receiving element, wherein
the semiconductor integrated circuit as defined in claim 1 is mounted on at least either one of the light-emission control circuit and the light-receiving circuit.

* * * * *